(12) United States Patent
Chou

(10) Patent No.: US 11,545,215 B2
(45) Date of Patent: Jan. 3, 2023

(54) DEVICES AND METHODS FOR WRITING TO A MEMORY CELL OF A MEMORY

(71) Applicant: Taiwan Semiconductor Manufacturing Company Limited, Hsinchu (TW)

(72) Inventor: Chung-Cheng Chou, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 180 days.

(21) Appl. No.: 17/030,536

(22) Filed: Sep. 24, 2020

(65) Prior Publication Data
US 2021/0005258 A1 Jan. 7, 2021

Related U.S. Application Data

(60) Continuation of application No. 16/458,442, filed on Jul. 1, 2019, now Pat. No. 10,796,760, which is a division of application No. 14/989,064, filed on Jan. 6, 2016, now Pat. No. 10,340,004, which is a continuation of application No. 14/554,547, filed on Nov. 26, 2014, now Pat. No. 9,257,178.

(51) Int. Cl.
*G11C 11/4074* (2006.01)
*G11C 13/00* (2006.01)

(52) U.S. Cl.
CPC ...... *G11C 13/0069* (2013.01); *G11C 11/4074* (2013.01); *G11C 13/0002* (2013.01); *G11C 13/0038* (2013.01)

(58) Field of Classification Search
CPC .......... G11C 11/4074; G11C 13/0038; G11C 13/0002; G11C 13/0069
USPC .................................................... 365/148
See application file for complete search history.

(56) References Cited

U.S. PATENT DOCUMENTS

| | | | |
|---|---|---|---|
| 6,594,185 B1 | 7/2003 | Takagi | |
| 7,400,536 B1 | 7/2008 | Lin et al. | |
| 8,502,751 B2 * | 8/2013 | Nathan | H05B 45/60 345/82 |
| 9,064,573 B2 | 6/2015 | Kawai et al. | |
| 2003/0235086 A1 | 12/2003 | Lin | |
| 2005/0249022 A1 * | 11/2005 | Martines | G11C 16/24 365/230.06 |
| 2006/0220071 A1 * | 10/2006 | Kang | G11C 13/0004 257/248 |
| 2006/0245250 A1 * | 11/2006 | Komori | G11C 16/12 365/185.14 |
| 2007/0236420 A1 * | 10/2007 | Huang | G09G 3/3216 345/76 |
| 2008/0180555 A1 | 7/2008 | Sato et al. | |
| 2009/0003076 A1 * | 1/2009 | Yun | G11C 16/26 365/185.21 |
| 2009/0086534 A1 * | 4/2009 | DeBrosse | G11C 29/028 365/205 |

(Continued)

*Primary Examiner* — Sung Il Cho
(74) *Attorney, Agent, or Firm* — Jones Day

(57) ABSTRACT

A method for writing to a memory is disclosed. The method includes generating a write current that flows to a memory cell of the memory, generating a mirror current that mirrors the write current, and inhibiting application of a write voltage to the memory cell of the memory based on the mirror current. A device that performs the method is also disclosed. A memory that includes the device is also disclosed.

20 Claims, 9 Drawing Sheets

(56) References Cited

U.S. PATENT DOCUMENTS

| | | | |
|---|---|---|---|
| 2009/0097323 A1* | 4/2009 | Bode | G11C 5/147 |
| | | | 365/185.21 |
| 2009/0237992 A1* | 9/2009 | Maejima | G11C 11/5642 |
| | | | 365/185.23 |
| 2011/0182113 A1* | 7/2011 | Yoon | G11C 29/44 |
| | | | 365/201 |
| 2013/0235649 A1 | 9/2013 | Lindstadt et al. | |
| 2013/0271106 A1* | 10/2013 | Tsai | G05F 3/262 |
| | | | 323/315 |
| 2014/0016414 A1 | 1/2014 | Tsai et al. | |
| 2014/0043887 A1 | 2/2014 | Lym et al. | |
| 2014/0177353 A1* | 6/2014 | Park | G11C 13/0002 |
| | | | 365/189.14 |
| 2014/0313812 A1* | 10/2014 | Yim | G11C 11/1659 |
| | | | 365/148 |

* cited by examiner

DEVICES AND METHODS FOR WRITING TO A MEMORY CELL OF A MEMORY

CROSS-REFERENCE TO RELATED APPLICATIONS

This application is a continuation application of U.S. patent application Ser. No. 16/458,442, filed Jul. 1, 2019; which is a divisional application of U.S. patent application Ser. No. 14/989,064, filed Jan. 6, 2016, and issued U.S. Pat. No. 10,340,004; which is a continuation application of U.S. patent application Ser. No. 14/554,547, filed Nov. 26, 2014, and issued U.S. Pat. No. 9,257,178. The contents of all of these applications are incorporated by reference herein in their entirety.

BACKGROUND

A resistive random access memory (RRAM) includes a plurality of RRAM cells that are operable to transition from a high resistance state to a low resistance state to thereby "set" the RRAM cells, and conversely to "reset" the RRAM cells. The high resistance state and the low resistance state represent a single bit "0" or "1" of data, whereby data are stored in the RRAM. The RRAM cells are set or reset by applying different voltages and currents on the RRAM cells. These voltages and currents cause stress on the RRAM cells when applied on the RRAM cells for a prolonged period of time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
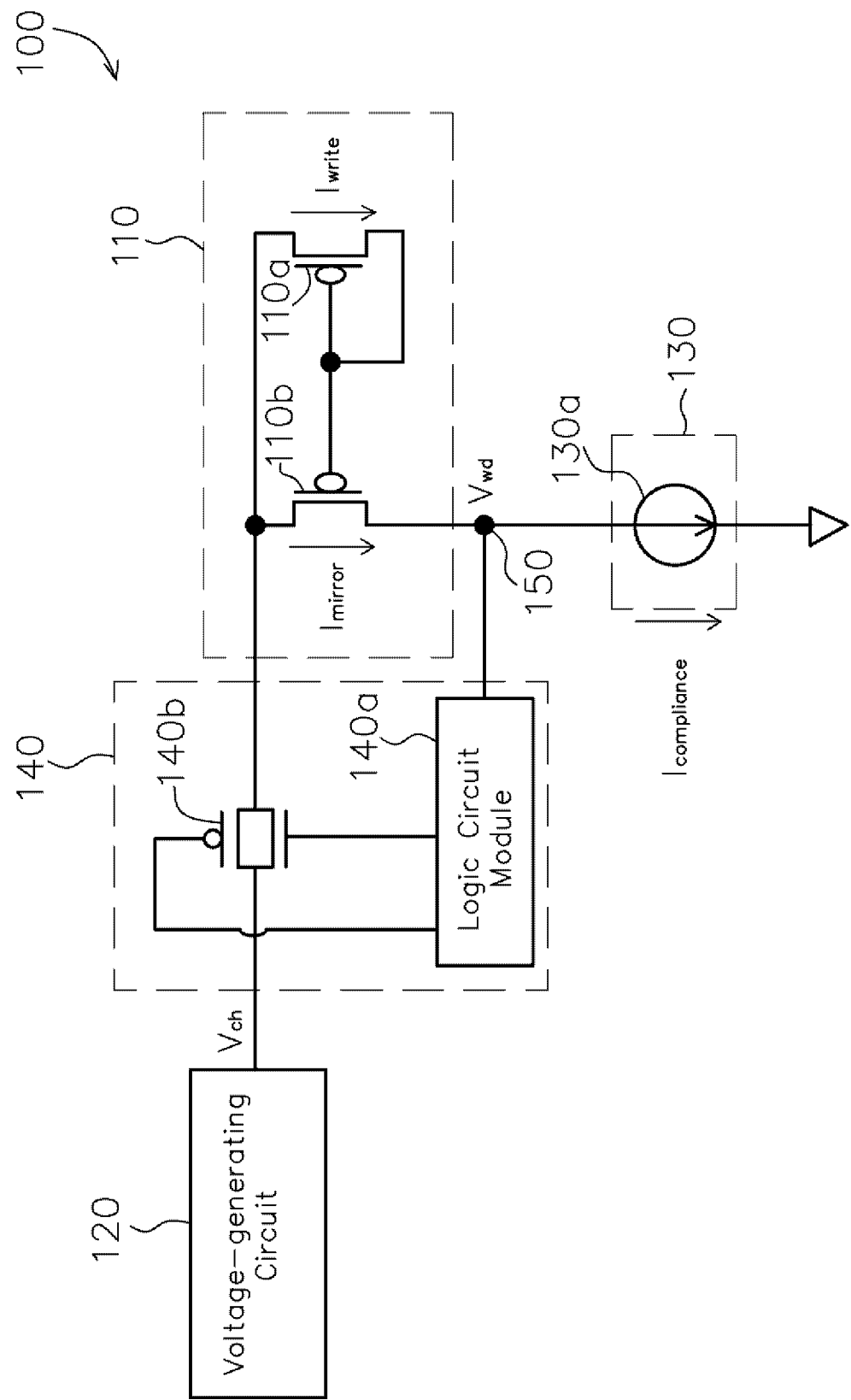
FIG. 1 is a schematic diagram of an exemplary device for writing to a memory cell of a memory in accordance with some embodiments.

Before the present disclosure is described in greater detail, it should be noted that like elements are denoted by the same reference numerals throughout the disclosure.

The present disclosure provides a method for writing to, i.e., setting or resetting, a memory cell of a memory using a device. In an exemplary method, the device generates a write voltage, permits application of the write voltage to the memory cell, and generates a write current that flows through the memory cell to set or reset the memory cell. When the memory cell is set or reset, the device inhibits the application of the write voltage to the memory cell, thereby stopping flow of the write current through the memory cell.

FIG. 1 is a schematic diagram of an exemplary device 100 for writing to a memory cell of a memory in accordance with some embodiments.

As illustrated in FIG. 1, the device 100 includes a current mirror circuit 110, a voltage-generating circuit 120, a current source circuit 130, and a switch circuit 140.

The current mirror circuit 110 includes a first transistor 110a and a second transistor 110b. In this exemplary embodiment, each of the first and second transistors 110a, 110b is a P-type metal-oxide-semiconductor (PMOS) transistor and includes a source terminal, a drain terminal, and a gate terminal. The gate and drain terminals of the first transistor 110a are connected to each other and to the gate terminal of the second transistor 110b. The drain terminal of the second transistor 110b is connected to a node 150.

Since the gate and drain terminals of the first transistor 110a are connected, the first transistor 110a is configured as a diode-connected transistor, and thus operates in a saturation region. Further, since the gate terminal of the second transistor 110b is connected to the gate terminal of the first transistor 110a, a voltage across the gate terminal and the source terminal, i.e., a gate-source voltage, of the second transistor 110b is substantially equal to a gate-source voltage of the first transistor 110a. As such, the second transistor 110b is configured to mirror a write current $I_{write}$ flowing through the first transistor 110a.

In an alternative exemplary embodiment, at least one of the first and second transistors 110a, 110b of the current mirror circuit 110 is an N-type metal-oxide-semiconductor (NMOS) transistor.

Figure 2:
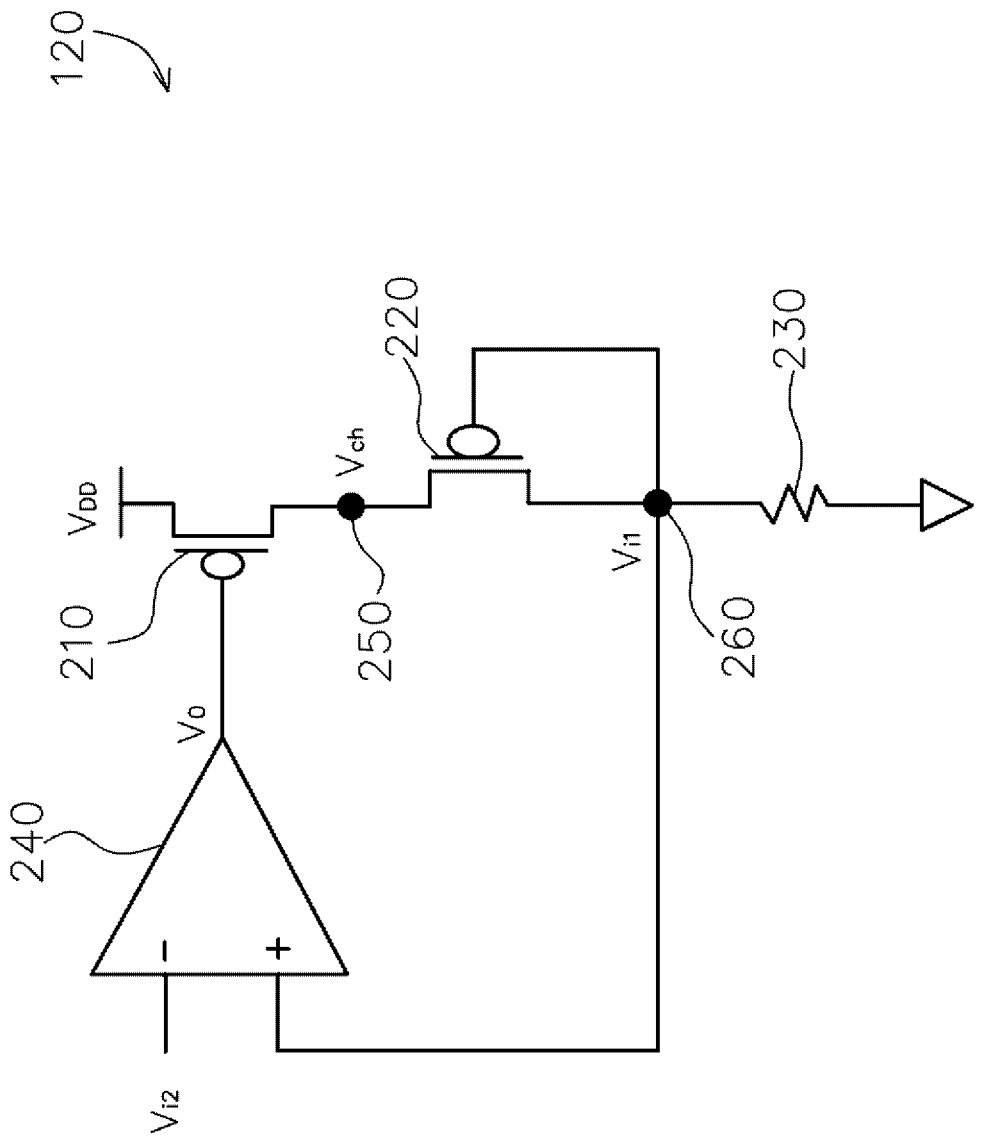
FIG. 2 is a schematic diagram illustrating a voltage-generating circuit of a device in accordance with some embodiments.

FIG. 2 is a schematic diagram illustrating the voltage-generating circuit 120 of the device 100 in accordance with some embodiments.

As illustrated in FIG. 2, the voltage-generating circuit 120 includes a first transistor 210, a second transistor 220, a resistor 230, and an operational amplifier 240. In this exemplary embodiment, each of the first and second transistors 210, 220 is a PMOS transistor. The first and second transistors 210, 220 and the resistor 230 are connected in series between a supply voltage $V_{DD}$ and the ground. In particular, the first transistor 210 includes a source terminal connected to the supply voltage $V_{DD}$, a drain terminal connected to a node 250, and a gate terminal. The second transistor 220 is configured as a diode-connected transistor, and includes a source terminal connected to the node 250, and a drain terminal and a gate terminal connected to each other and to a node 260. The resistor 230 is connected between the node 260 and the ground.

The operational amplifier 240 has an inverting input terminal, a non-inverting input terminal connected to the node 260, and an output terminal connected to the gate terminal of the first transistor 210.

In operation, when a first input voltage $V_{i1}$ at the node 260 is initially greater than a second input voltage $V_{i2}$ at the inverting input terminal of the operational amplifier 240, an output $V_o$ at the output terminal of the operational amplifier 240 is high and the first transistor 210 is thus in a low conduction state. This causes the first input voltage $V_{i1}$ to decrease. When the first input voltage $V_{i1}$ decreases to less than the second input voltage $V_{i2}$, the output $V_o$ goes low. This causes the first transistor 210 to transition from the low conduction state to a high conduction state. This, in turn, causes the first input voltage $V_{i1}$ to increase. When the first input voltage $V_{i1}$ increases to greater than the second input voltage $V_{i2}$, the output $V_o$ goes high again. This causes the first transistor 210 to transition from the high conduction state back to the low conduction state. This, in turn, causes the first input voltage $V_{i1}$ to decrease again.

Based on the operation of the voltage-generating circuit 120, the voltage-generating circuit 120 is configured to generate a write voltage $V_{ch}$ at the node 250 thereof substantially equal to the sum of the second input voltage $V_{i2}$ and a threshold voltage of the second transistor 220.

In an alternative exemplary embodiment, at least one of the first and second transistors 210, 220 of the voltage-generating circuit 120 is an NMOS transistor.

Referring back to FIG. 1, the current source circuit 130 is configured to generate a predetermined compliance current $I_{compliance}$. In this exemplary embodiment, the current source circuit 130 includes a constant current source 130a connected between the node 150 and the ground. In an exemplary embodiment, when a mirror current $I_{mirror}$ flowing through the second transistor 110b is less/greater than the predetermined compliance current $I_{compliance}$, a write detect voltage $V_{wd}$ less/greater than a threshold value, e.g., half the write voltage $V_{ch}$, is generated at the node 150. On the other hand, in an exemplary embodiment, when a mirror current $I_{mirror}$ flowing through the second transistor 110b is substantially equal to the predetermined compliance current $I_{compliance}$, a write detect voltage $V_{wd}$ substantially equal to a threshold value, e.g., half the write voltage $V_{ch}$, is generated at the node 150.

The switch circuit 140 includes a logic circuit module 140a and a transmission gate module 140b.

The logic circuit module 140a is configured to detect the write detect voltage $V_{wd}$, and to generate a pair of logic levels indicative of the write detect voltage $V_{wd}$ detected thereby. In this exemplary embodiment, the logic circuit module 140a has an input terminal connected to the node 150, an output terminal, and a complementary output terminal. In an exemplary embodiment, when it is detected that the write detect voltage $V_{wd}$ is less/greater than a threshold value, e.g., half the write voltage $V_{ch}$, the logic circuit module 140a outputs low and high logic levels at the output terminal and the complementary output terminal thereof, respectively. On the other hand, in an exemplary embodiment, when it is detected that the write detect voltage $V_{wd}$ is substantially equal to a threshold value, e.g., half the write voltage $V_{ch}$, the logic circuit module 140a outputs high and low logic levels at the output terminal and the complementary output terminal thereof, respectively.

The transmission gate module 140b is responsive to the logic levels output by the logic circuit module 140a. In this exemplary embodiment, the transmission gate module 140b includes parallel-connected PMOS and NMOS transistors; an input terminal connected to the node 250 of the voltage-generating circuit 120; an output terminal connected to the source terminals of the first and second transistors 110a, 110b; a PMOS gate terminal connected to the output terminal of the logic circuit module 140a; and an NMOS gate terminal connected to the complementary output terminal of the logic circuit module 140a. In response to low and high logic levels applied by the logic circuit module 140a to the PMOS and NMOS gate terminals thereof, respectively, the transmission gate module 140b makes a transmission path between the input and output terminals thereof. This connects the node 250 of the voltage-generating circuit 120 to the source terminals of the first and second transistors 110a, 110b and permits application of the write voltage $V_{ch}$ to the source terminals of the first and second transistors 110a, 110b, whereby the write current $I_{write}$ is generated. Conversely, in response to high and low logic levels applied by the logic circuit module 140a to the PMOS and NMOS gate terminals thereof, respectively, the transmission gate module 140b breaks the transmission path between the input and output terminals thereof. This disconnects the node 250 of the voltage-generating circuit 120 from the source terminals of the first and second transistors 110a, 110b and inhibits the application of the write voltage $V_{ch}$ to the source terminals of the first and second transistors 110a, 110b, thereby stopping the generation of the write current $I_{write}$.

Figure 3:
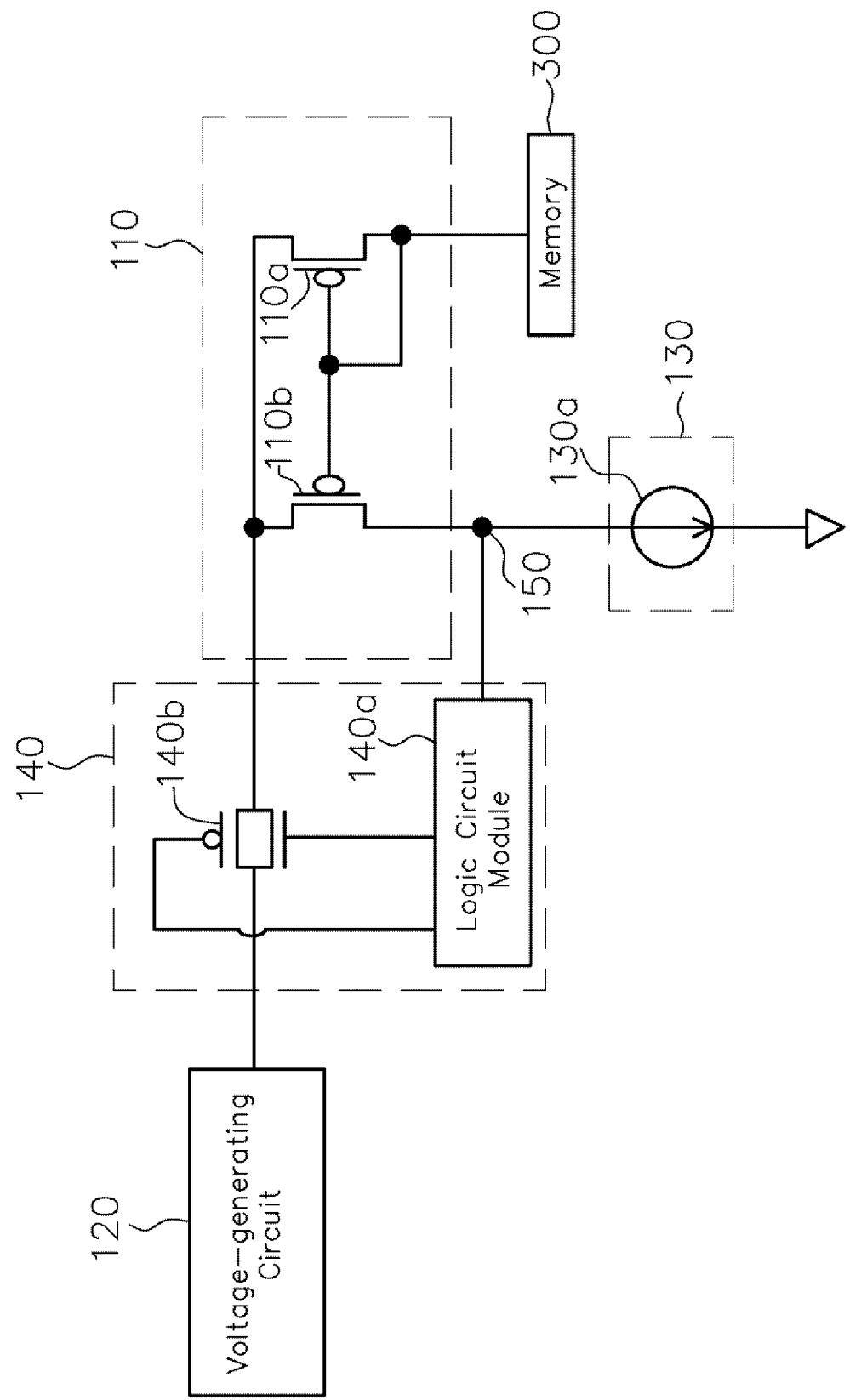
FIG. 3 is a schematic diagram illustrating a device connected to a memory in accordance with some embodiments.

FIG. 3 is a schematic diagram illustrating the device 100 connected to a memory 300 in accordance with some embodiments.

As illustrated in FIG. 3, the memory 300 is connected to the drain terminal of the first transistor 110a. In this exemplary embodiment, the memory 300 is a resistive random access memory (RRAM). In an alternative exemplary embodiment, the memory 300 is a phase change random access memory (PC-RAM), a conducting bridge random access memory (CB-RAM), or another programmable resistive memory.

Figure 4:
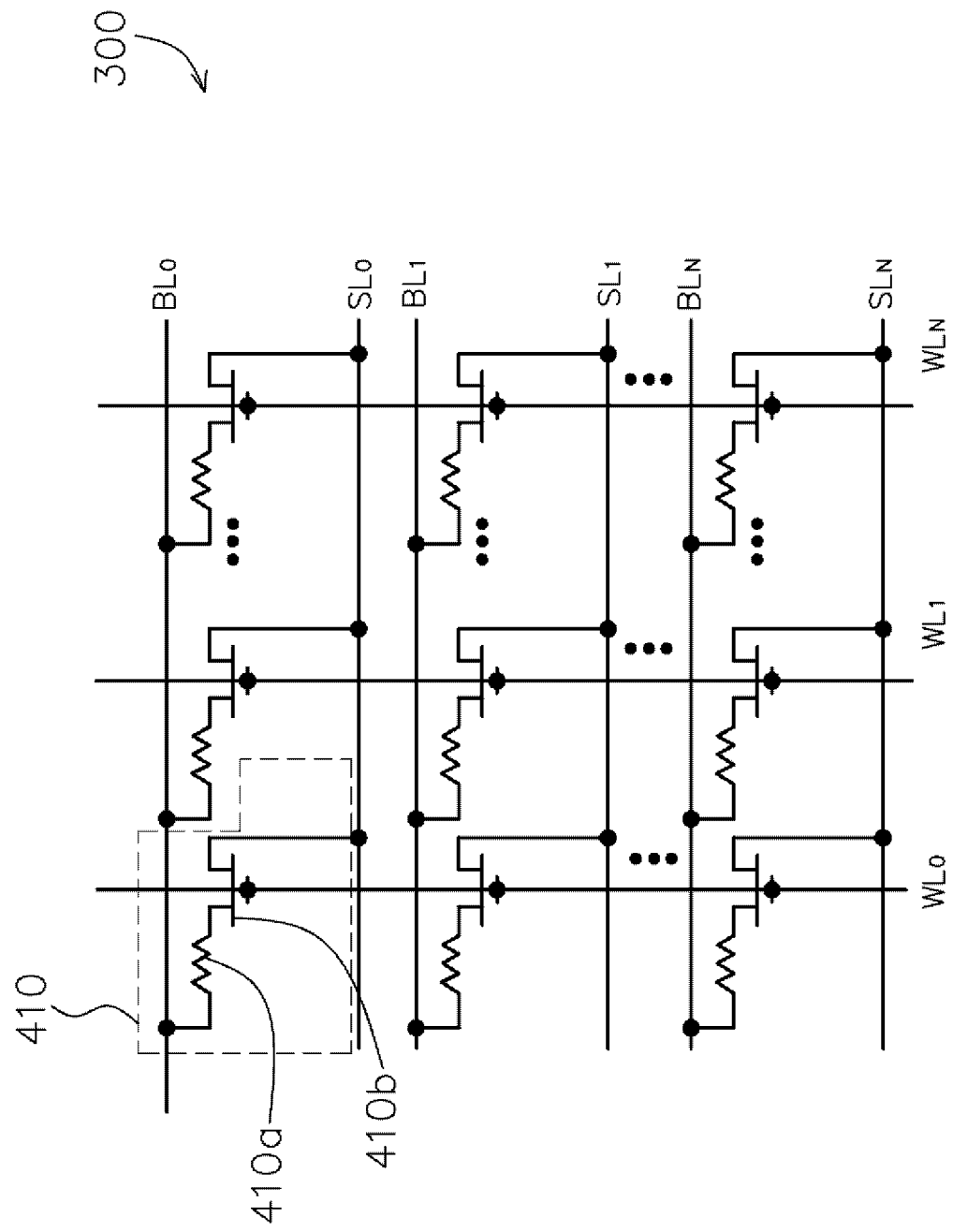
FIG. 4 is a schematic diagram illustrating a memory cell of a memory in accordance with some embodiments.

FIG. 4 is a schematic diagram illustrating a RRAM cell 410 of the RRAM 300 in accordance with some embodiment.

As illustrated in FIG. 4, the RRAM 300 includes a plurality of 1T1R RRAM cells 410 (only one of the RRAM cells 410 is labeled in FIG. 4) that are arranged in a matrix of rows and columns. The RRAM cells 410 in each of the rows are connected between a corresponding one of bit lines $BL_0, BL_1, \ldots$ and $BL_N$ of the RRAM 300 and a corresponding one of source lines $SL_0, SL_1, \ldots$ and $SL_N$ of the RRAM 300. The RRAM cells 410 in each of the columns are connected to a corresponding one of word lines $WL_0, WL_1, \ldots WL_N$ of the RRAM 300. Since the RRAM cells 410 are identical in structure and operation, only one of the RRAM cells 410 will be described herein.

The RRAM cell 410 includes a variable resistor 410a and an access transistor 410b that are connected in series between a bit line, e.g., the $BL_0$, and a source line, e.g., the source line $SL_0$. The access transistor 410b has a gate terminal connected to a word line, e.g., $WL_0$. It is noted that the access transistor 410b has a negligible resistance, and thus the RRAM cell 410 has a resistance that is substantially equal to a resistance of the variable resistor 410a.

In this exemplary embodiment, when the RRAM cell 410 is in a low resistance state, the RRAM cell 410 is set. Conversely, when the RRAM cell 410 is in a high resistance state, the RRAM cell 410 is reset.

Figure 5:
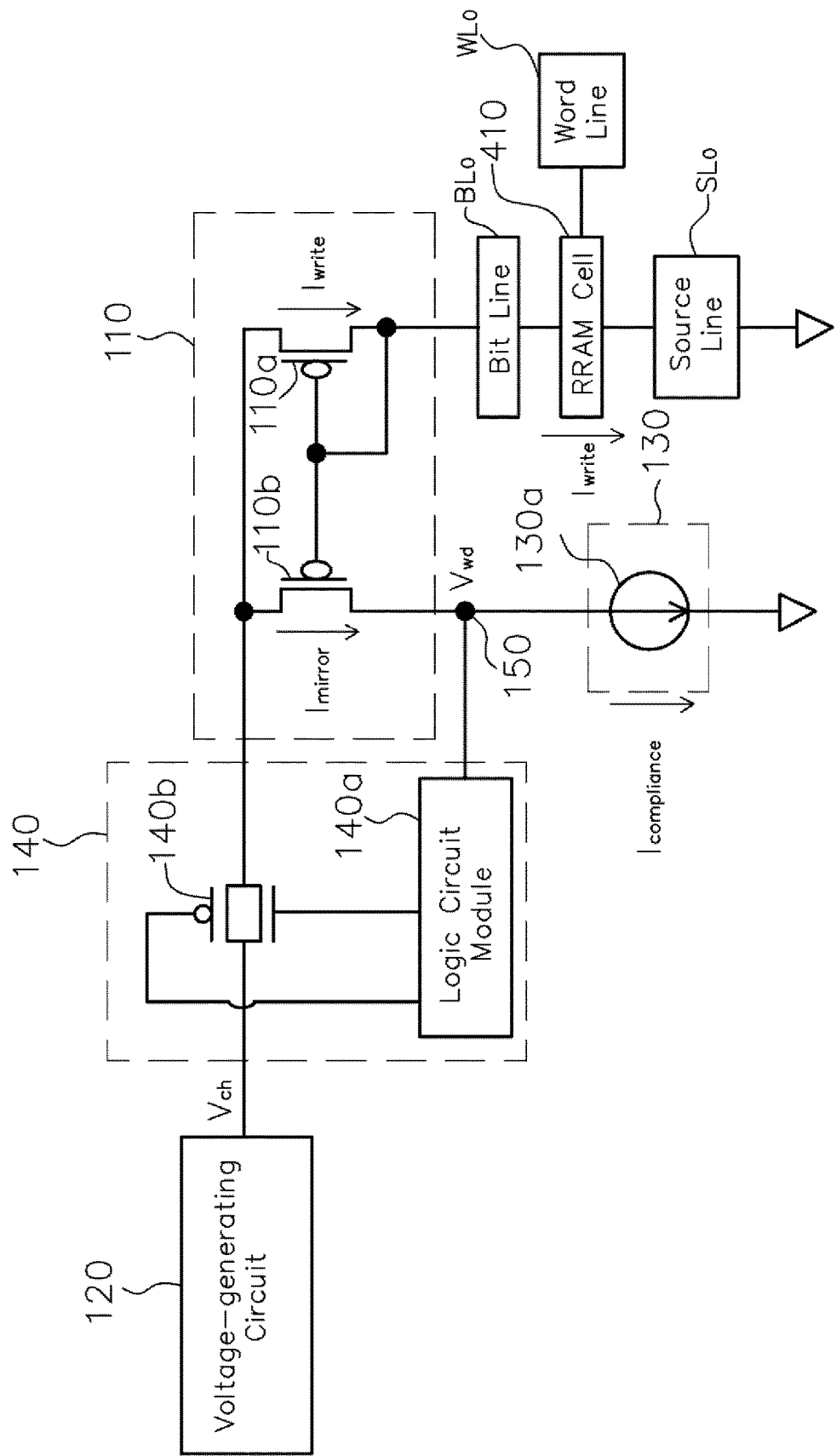
FIG. 5 is a schematic diagram illustrating a device connected to a memory cell of a memory in accordance with some embodiments.
Figure 6:
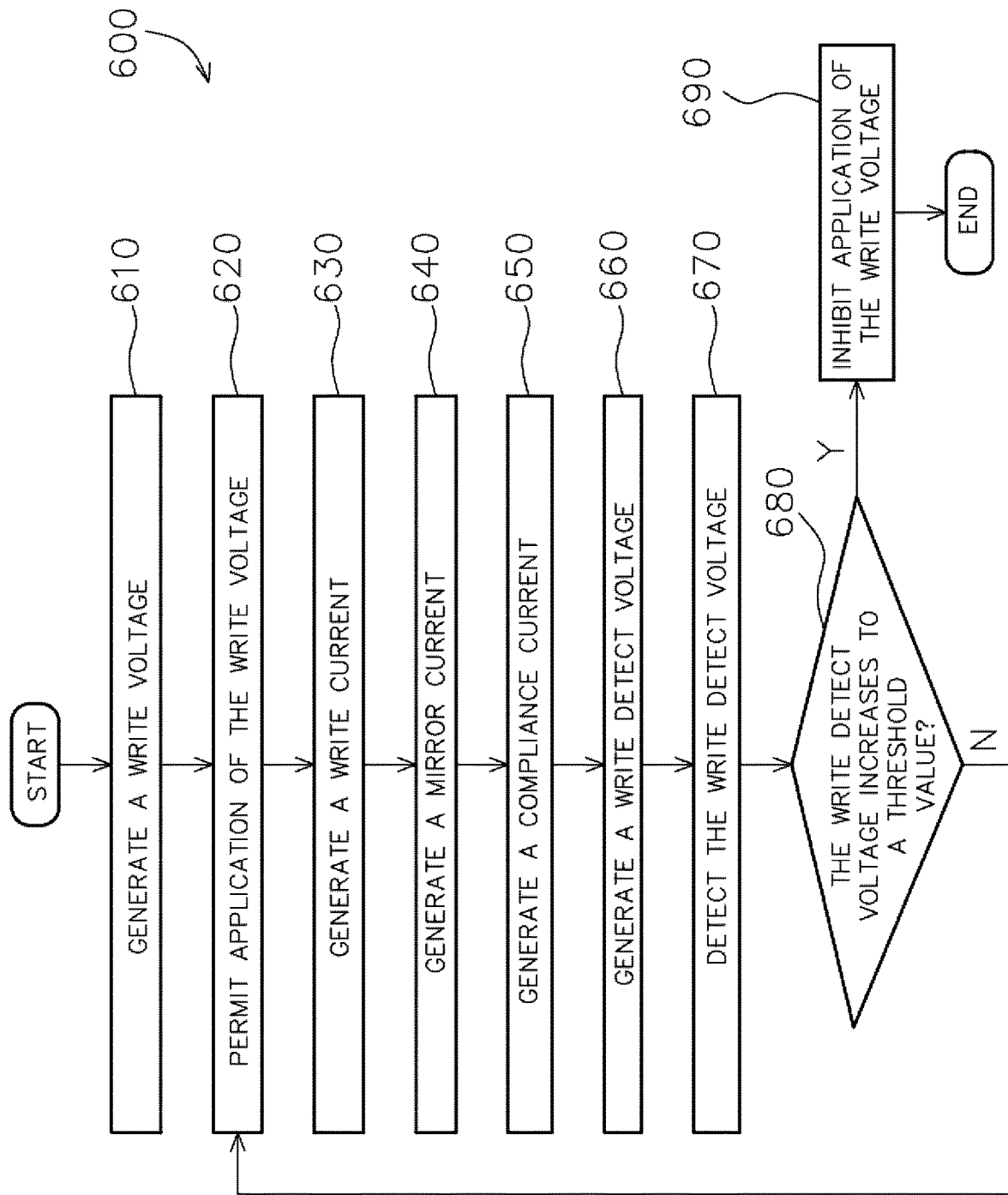
FIG. 6 is a flowchart of an exemplary method for writing to a memory cell of a memory in accordance with some embodiments.

FIG. 5 is a schematic diagram illustrating the device 100 connected to the RRAM cell 410 of the RRAM 300 in accordance with some embodiments and FIG. 6 is a flowchart of an exemplary method 600 for writing to the RRAM cell 410 of the RRAM 300 in accordance with some embodiments.

An exemplary embodiment of a method for setting a memory cell, e.g., the RRAM cell 410, of a memory, e.g., the RRAM 300, using a device, e.g., the device 100, will now be described with reference to FIG. 5 and FIG. 6.

In operation 610, the voltage-generating circuit 120 generates a write voltage $V_{ch}$.

In an exemplary embodiment, the write voltage $V_{ch}$ is substantially equal to the sum of a threshold voltage of the first transistor 110a of the current mirror circuit 110 and a voltage across the RRAM cell 410. In such an exemplary embodiment, the threshold voltage of the second transistor 220 of the voltage-generating circuit 120 and the second input voltage $V_{i2}$ at the inverting input terminal of the operational amplifier 240 of the voltage-generating circuit 120 are respectively and substantially equal to the threshold voltage of the first transistor 110a of the current mirror circuit 110 and the voltage across the RRAM cell 410.

In operation 620, in response to low and high logic levels applied by the logic circuit module 140a of the switch circuit 140 to the PMOS and NMOS gate terminals of the transmission gate module 140b of the switch circuit 140, respectively, the transmission gate module 140b of the switch circuit 140 makes a transmission path between the input and output terminals thereof. This connects the node 250 of the voltage-generating circuit 120 to the source terminals of the first and second transistors 110a, 110b of the current mirror circuit 110 and permits application of the write voltage $V_{ch}$ to the RRAM cell 410.

In operation 630, a write current $I_{write}$ is generated and flows through the first transistor 110a of the current mirror circuit 110.

In this exemplary embodiment, the bit line $BL_0$ is connected to the drain terminal of the first transistor 110a of the current mirror circuit 110, the source line $SL_0$ is connected to the ground, and the word line $WL_0$ is connected to a voltage source (not shown). As a result, the write current $I_{write}$ further flows from the bit line $BL_0$ to the source line $SL_0$ through the RRAM cell 410. This causes the RRAM cell 410 to transition from a high resistance state to a low resistance state. This, in turn, causes the write current $I_{write}$ to increase.

In operation 640, a mirror current $I_{mirror}$ is generated and flows through the second transistor 110b of the current mirror circuit 110. The mirror current $I_{mirror}$ mirrors the write current $I_{write}$. That is, an increase in the write current $I_{write}$ results in a corresponding increase in the mirror current $I_{mirror}$.

In operation 650, the constant current source 130a of the current source circuit 130 generates a predetermined compliance current $I_{compliance}$.

In an exemplary embodiment, the first and second transistors 110a, 110b of the current mirror circuit 110 have substantially the same W/L ratio, i.e., the ratio of a width to a length of a channel of a transistor. As such, a ratio of the mirror current $I_{mirror}$ to a write current $I_{write}$ is substantially equal to one. In such an exemplary embodiment, the predetermined compliance current $I_{compliance}$ is about the write current $I_{write}$ when the RRAM cell 410 is in the low resistance state, i.e., is set.

In another exemplary embodiment, the first transistor 110a of the current mirror circuit 110 has a W/L ratio M times larger than a W/L ratio of the second transistor 110b of the current mirror circuit 110. As such, a ratio of the mirror current $I_{mirror}$ to the write current $I_{write}$ is 1:M. In such another exemplary embodiment, the predetermined compliance current $I_{compliance}$ is about M times smaller than the write current $I_{write}$ when the RRAM cell 410 is in the low resistance state, i.e., is set, thereby reducing a power consumption of the constant current source 130a of the current source circuit 130.

In operation 660, a write detect voltage $V_{wd}$ is generated at the node 150.

As the RRAM cell 410 transitions to the low resistance state, the mirror current $I_{mirror}$ increases to the predetermined compliance current $I_{compliance}$. In this exemplary embodiment, as the mirror current $I_{mirror}$ increases to the predetermined compliance current $I_{compliance}$, the write detect voltage $V_{wd}$ increases to a threshold value, e.g., half the write voltage $V_{ch}$. As such, when the RRAM cell 410 transitions to the low resistance state and is thus set, the write detect voltage $V_{wd}$ increases to the threshold value, e.g., half the write voltage $V_{ch}$.

In operation 670, the logic circuit module 140a of the switch circuit 140 detects the write detect voltage $V_{wd}$.

In operation 680, when it is detected that the write detect voltage $V_{wd}$ increases, i.e., is substantially equal, to the threshold value, e.g., half the write voltage $V_{ch}$, the logic circuit module 140a of the switch circuit 140 outputs high and low logic levels at the output terminal and the complementary output terminal thereof that are applied to the PMOS and NMOS gate terminals of the transmission gate module 140b of the switch circuit 140, respectively. Otherwise, i.e., when it is detected that the write detect voltage $V_{wd}$ is less than the threshold value, e.g., half the write voltage $V_{ch}$, the logic circuit module 140a of the switch circuit 140 outputs low and high logic levels at the output terminal and the complementary output terminal thereof that are applied to the PMOS and NMOS gate terminals of the transmission gate module 140b of the switch circuit 140, respectively, and the flow goes back to operation 620.

In operation 690, in response to the high and low logic levels applied by the logic circuit module 140a of the switch circuit 140 to the PMOS and NMOS gate terminals thereof, respectively, the transmission gate module 140b of the switch circuit 140 breaks the transmission path between the input and output terminals thereof. This disconnects the node 250 of the voltage-generating circuit 120 from the source terminals of the first and second transistors 110a, 110b of the current mirror circuit 110 and inhibits the application of the write voltage $V_{ch}$ to the RRAM cell 410.

Based on the operation of the device 100, the switch circuit 140 disconnects the voltage-generating circuit 120 from the RRAM cell 410 to inhibit application of the write voltage $V_{ch}$ to the RRAM cell 410 when the RRAM cell 410 is set. As a result, the RRAM cell 410 is protected from over-set or stress.

Figure 7:
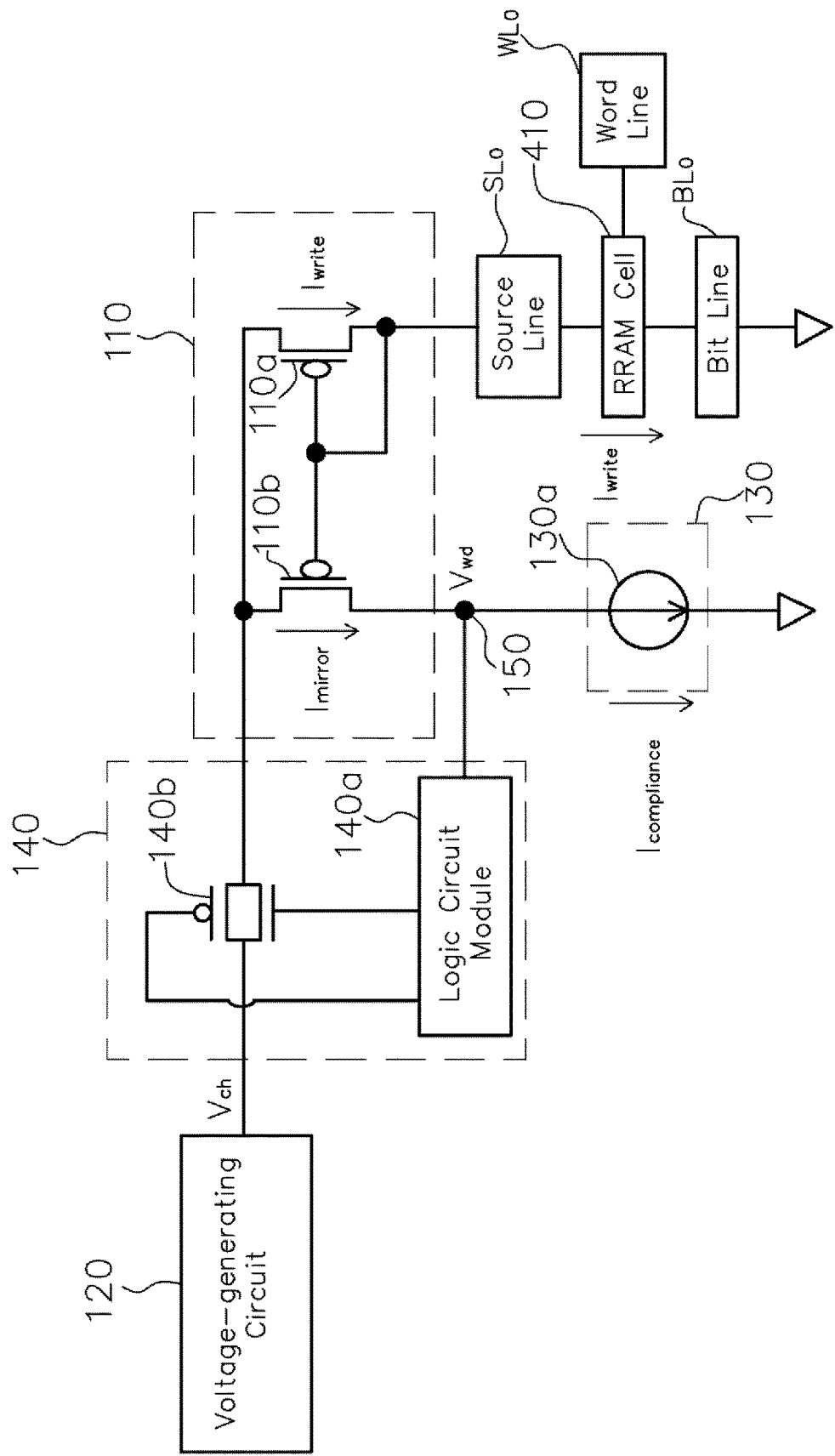
FIG. 7 is a schematic diagram illustrating a device connected to a memory cell of a memory in accordance with some embodiments.
Figure 8:
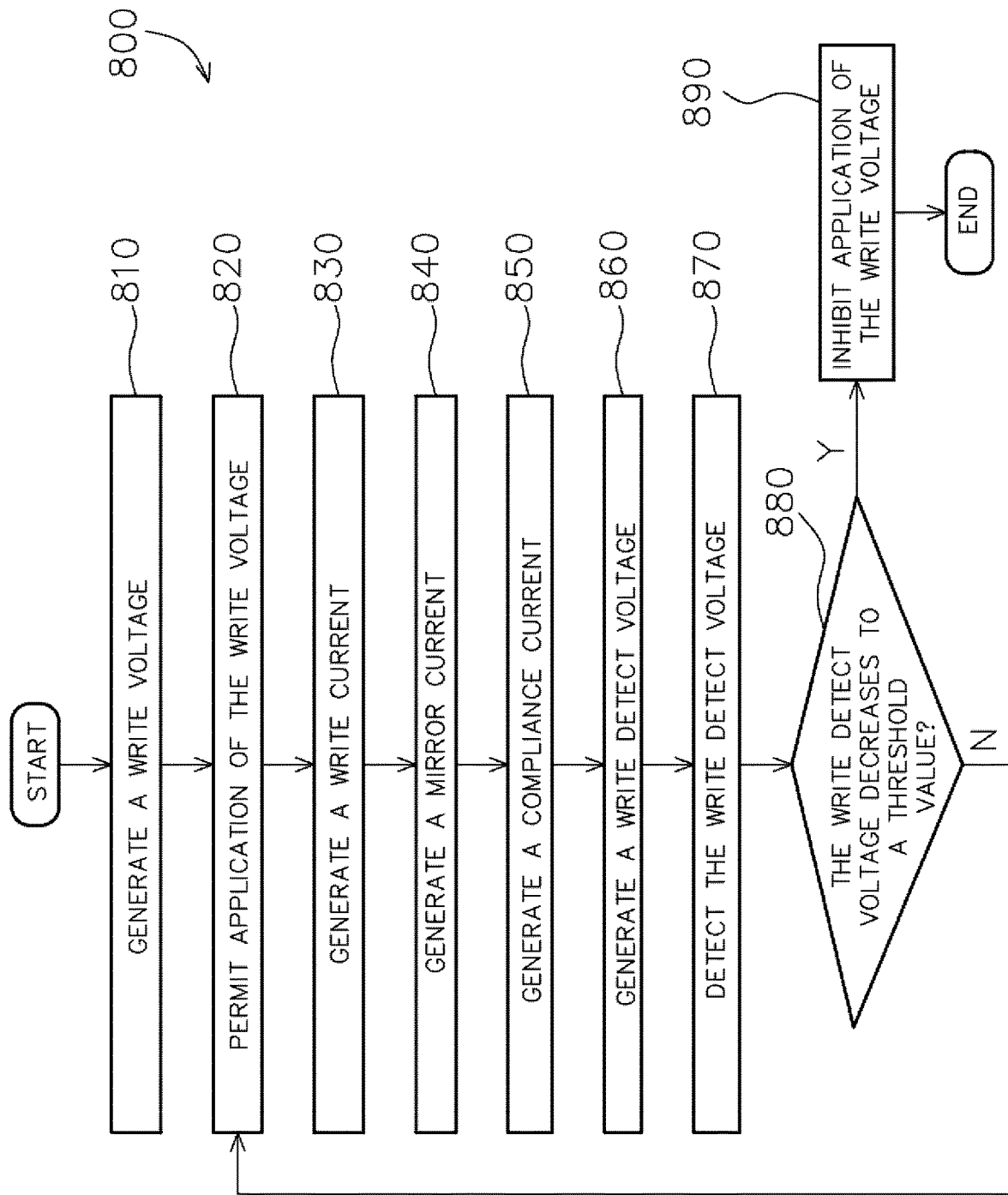
FIG. 8 is flowchart of another exemplary method for writing to a memory cell of a memory in accordance with some embodiments.

FIG. 7 is a schematic diagram illustrating the device 100 connected to the RRAM cell 410 of the RRAM 300 in accordance with some embodiments and FIG. 8 is a flowchart of another exemplary method 800 for writing to the RRAM cell 410 of the RRAM 300 in accordance with some embodiments.

An exemplary embodiment of a method for resetting a memory cell, e.g., the RRAM cell 410, of a memory, e.g., the RRAM 300, using a device, e.g., the device 100, will now be described with reference to FIG. 7 and FIG. 8.

In operation 810, the voltage-generating circuit 120 generates a write voltage $V_{ch}$.

In an exemplary embodiment, the write voltage $V_{ch}$ is substantially equal to the sum of a threshold voltage of the first transistor 110a of the current mirror circuit 110 and a voltage across the RRAM cell 410. In such an exemplary embodiment, the threshold voltage of the second transistor 220 of the voltage-generating circuit 120 and the second input voltage $V_{i2}$ at the inverting input terminal of the operational amplifier 240 of the voltage-generating circuit 120 are respectively and substantially equal to the threshold voltage of the first transistor 110a of the current mirror circuit 110 and the voltage across the RRAM cell 410.

In operation 820, in response to low and high logic levels applied by the logic circuit module 140a of the switch circuit 140 to the PMOS and NMOS gate terminals of the transmission gate module 140b of the switch circuit 140, respectively, the transmission gate module 140b of the switch circuit 140 makes a transmission path between the input and output terminals thereof. This connects the node 250 of the voltage-generating circuit 120 to the source terminals of the first and second transistors 110a, 110b of the current mirror circuit 110 and permits application of the write voltage $V_{ch}$ to the RRAM cell 410.

In operation 830, a write current $I_{write}$ is generated and flows through the first transistor 110a of the current mirror circuit 110.

In this exemplary embodiment, the source line $SL_0$ is connected to the drain terminal of the first transistor 110a of the current mirror circuit 110, the bit line $BL_0$ is connected to the ground, and the word line $WL_0$ is connected to a voltage source (not shown). As a result, the write current $I_{write}$ further flows from the source line $SL_0$ to the bit line $BL_0$ through the RRAM cell 410. This causes the RRAM cell 410 to transition from a low resistance state to a high resistance state. This, in turn, causes the write current $I_{write}$ to decrease.

In operation 840, a mirror current $I_{mirror}$ is generated and flows through the second transistor 110b of the current mirror circuit 110. The mirror current $I_{mirror}$ mirrors the write current $I_{write}$. That is, a decrease in the write current $I_{write}$ results in a corresponding decrease in the mirror current $I_{mirror}$.

In operation 850, the constant current source 130a of the current source circuit 130 generates a predetermined compliance current $I_{compliance}$.

In an exemplary embodiment, the first and second transistors 110a, 110b of the current mirror circuit 110 have substantially the same W/L ratio. As such, a ratio of the mirror current $I_{mirror}$ to the write current $I_{write}$ is substantially equal to one. In such an exemplary embodiment, the predetermined compliance current $I_{compliance}$ is about the write current $I_{write}$ when the RRAM cell 410 is in the high resistance state, i.e., is reset.

In another exemplary embodiment, the first transistor 110a of the current mirror circuit 110 has a W/L ratio M times larger than a W/L ratio of the second transistor 110b of the current mirror circuit 110. As such, a ratio of the mirror current $I_{mirror}$ to the write current $I_{write}$ is 1:M. In such an alternative exemplary embodiment, the predetermined compliance current $I_{compliance}$ is about M times smaller than the write current $I_{write}$ when the RRAM cell 410 is in the high resistance state, i.e., is reset, thereby reducing a power consumption of the constant current source 130a of the current source circuit 130.

In operation 860, a write detect voltage $V_{wd}$ is generated at the node 150.

As the RRAM cell 410 transitions to the high resistance state, the mirror current $I_{mirror}$ decreases to the predetermined compliance current $I_{compliance}$. In this exemplary embodiment, as the mirror current $I_{mirror}$ decreases to the predetermined compliance current $I_{compliance}$, the write detect voltage $V_{wd}$ decreases to a threshold value, e.g., half the write voltage $V_{ch}$. As such, when the RRAM cell 410 transitions to the high resistance state and is thus reset, the write detect voltage $V_{wd}$ decreases to the threshold value, e.g., half the write voltage $V_{ch}$.

In operation 870, the logic circuit module 140a of the switch circuit 140 detects the write detect voltage $V_{wd}$.

In operation 880, when it is detected that the write detect voltage $V_{wd}$ decreases, i.e., is substantially equal, to the threshold value, e.g., half the write voltage $V_{ch}$, the logic circuit module 140a of the switch circuit 140 outputs high and low logic levels at the output terminal and the complementary output terminal thereof that are applied to the PMOS and NMOS gate terminals of the transmission gate module 140b of the switch circuit 140, respectively. Otherwise, i.e., when it is detected that the write detect voltage $V_{wd}$ is greater than the threshold value, e.g., half the write voltage $V_{ch}$, the logic circuit module 140a of the switch circuit 140 outputs low and high logic levels at the output terminal and the complementary output terminal thereof that are applied to the PMOS and NMOS gate terminals of the transmission gate module 140b of the switch circuit 140, respectively, and the flow goes back to operation 820.

In operation 890, in response to the high and low logic levels applied by the logic circuit module 140a of the switch circuit 140 to the PMOS and NMOS gate terminals thereof, respectively, the transmission gate module 140b of the switch circuit 140 breaks the transmission path between the input and output terminals thereof. This disconnects the node 250 of the voltage-generating circuit 120 from the source terminals of the first and second transistors 110a, 110b of the current mirror circuit 110 and inhibits the application of the write voltage $V_{ch}$ to the RRAM cell 410.

Based on the operation of the device 100, the switch circuit 140 disconnects the voltage-generating circuit 120 from the RRAM cell 410 to inhibit application of the write voltage $V_{ch}$ to the RRAM cell 410 when the RRAM cell 410 is reset. As a result, the RRAM cell 410 is protected from over-reset or stress.

Figure 9:
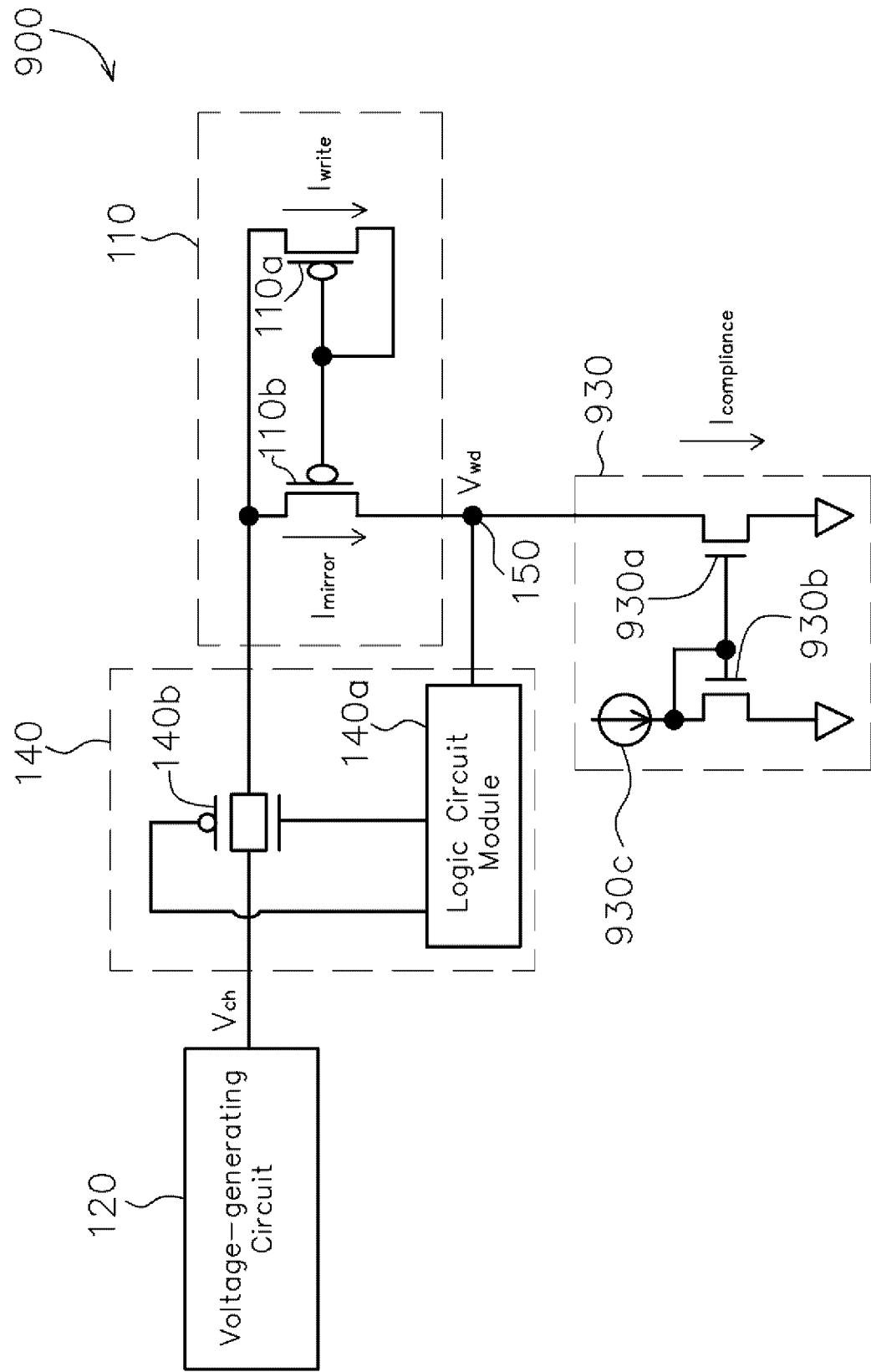
FIG. 9 is a schematic diagram of another exemplary device for writing to a memory cell of a memory in accordance with some embodiments.

FIG. 9 is a schematic diagram of another exemplary device 900 for writing to the RRAM cell 410 of the RRAM 300 in accordance with some embodiments. This exemplary embodiment differs from the previous exemplary embodiment in that the current source circuit 930 includes a first transistor 930a, a second transistor 930b, and a constant current source 930c.

In this exemplary embodiment, each of the first and second transistors 930a, 930b is an NMOS transistor. The first transistor 930a has a drain terminal connected to the node 150, a source terminal connected to the ground, and a gate terminal. The second transistor 930b is a diode-connected transistor, and has a gate terminal and a drain terminal connected to each other, to the gate terminal of the first transistor 930a, and to the constant current source 930c, and a source terminal connected to the ground.

In an alternative embodiment, at least one of the first and second transistors 930a, 930b is a PMOS transistor.

Also, in this exemplary embodiment, the first transistor 930a has a W/L ratio N times larger than a W/L ratio of the second transistor 930b. That is, a ratio of a source current, which is generated by the constant current source 930c and which flows through the second transistor 930b, to a predetermined compliance current $I_{compliance}$, which flows through the first transistor 930a, is 1:N. As such, in this exemplary embodiment, the constant current source 930c is configured to generate a source current N times smaller than the predetermined compliance current $I_{compliance}$, thereby reducing a power consumption of the constant current source 930c of the current source circuit 930.

In an embodiment of a device for writing to a memory, the device comprises a current mirror circuit and a voltage-generating circuit. The current mirror circuit is configured to generate a mirror current that mirrors a write current flowing to the memory and includes first and second transistors. The first transistor has a gate terminal and a source/drain terminal coupled to each other and to a memory cell of the memory. The second transistor has a gate terminal coupled to the gate terminal of the first transistor. The voltage-generating circuit is selectively coupled to the current mirror circuit and is configured to apply a write voltage to the memory.

In an embodiment of a memory, the memory comprises a memory cell, a current mirror circuit, and a voltage-generating circuit. The current mirror circuit is configured to generate a mirror current that mirrors a write current flowing to the memory cell and includes first and second transistors. The first transistor has a gate terminal and a source/drain terminal coupled to each other and to the memory cell. The second transistor has a gate terminal coupled to the gate terminal of the first transistor. The voltage-generating circuit is selectively coupled to the current mirror circuit and is configured to apply a write voltage to the memory cell.

In an embodiment of a method for writing to a memory, the method comprises generating a write current that flows to a memory cell of the memory, generating a mirror current that mirrors the write current, and inhibiting application of a write voltage to the memory cell of the memory based on the mirror current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A current mirror circuit comprising a first transistor and a second transistor; wherein:
    the second transistor has (i) a gate terminal coupled to the first transistor's gate terminal, and (ii) a source/drain terminal coupled to a current source circuit via a node;
    the current mirror circuit is selectively coupled to a voltage-generating circuit based on a write detect voltage at the node; and
    the current mirror circuit is configured to generate a mirror current that mirrors a write current flowing to a memory.

2. The current mirror circuit of claim 1, wherein the current source circuit is configured to generate a compliance current; and wherein the voltage-generating circuit is configured to apply a write voltage to the memory.

3. The current mirror circuit of claim 2, wherein the write detect voltage is generated at the node based on a comparison of the compliance current and the mirror current.

4. The circuit of claim 1, wherein the current source circuit includes a constant current source.

5. The circuit of claim 4, wherein the current source circuit further includes a pair of current source transistors that are coupled between the second transistor and the constant current source.

6. The circuit of claim 5, wherein the pair of current source transistors have different W/L ratios.

7. The circuit of claim 5, wherein the pair of current source transistors includes a first current source transistor connected from an output of the constant current source to ground, and the first current source transistor has a gate terminal directly connected to the output of the constant current source.

8. The circuit of claim 7, wherein the pair of current source transistors further includes a second current source transistor that is coupled from the node to ground, and the second current source transistor has a gate terminal coupled the gate terminal of the first current source transistor.

9. The circuit of claim 1, wherein the voltage-generating circuit includes a pair of voltage-generating transistors and a resistor connected in series between a supply voltage and ground.

10. The circuit of claim 9, wherein the voltage-generating circuit further includes an operational amplifier having an output terminal coupled to a gate terminal of the first voltage-generating transistor, and a non-inverting input terminal connected to a gate terminal of the second voltage-generating transistor.

11. The circuit of claim 1, wherein the memory is a resistive random access memory.

12. A method for writing to a memory, comprising:
    generating a mirror current that mirrors a write current flowing to the memory using a current mirror circuit, wherein the current mirror circuit includes:
    a first transistor having a gate terminal coupled to the memory; and
    a second transistor having (i) a gate terminal coupled to the gate terminal of the first transistor and (ii) a source/drain coupled to a node;
    applying a write voltage to the memory using a voltage-generating circuit;
    generating a compliance current using a current source circuit coupled to the second transistor; and
    controlling coupling of the voltage-generating circuit to the current mirror circuit based on a write detect voltage at the node.

13. The method of claim 12, wherein the memory is a resistive random access memory.

14. The method of claim 12, wherein the first and second transistors have different W/L ratios.

15. The method of claim 12, wherein the controlling of coupling of the voltage-generating circuit to the current mirror circuit comprises:
    detecting the write detect voltage using a logic circuit module; and
    generating by the logic circuit module a pair of logic levels indicative of the write detect voltage detected.

16. The method of claim 15, wherein the controlling of coupling of the voltage-generating circuit to the current mirror circuit further comprises:
    making, via a transmission gate module, a transmission path between the voltage-generating circuit and the current mirror circuit in response to the pair of logic levels generated by the logic circuit module.

17. The method of claim 15, wherein the logic circuit module has an input terminal connected to the node.

18. The method of claim 16, wherein the transmission gate module has a gate terminal connected to an output terminal of the logic circuit module.

19. The method of claim 12, wherein the voltage-generating circuit includes a pair of voltage-generating transistors and a resistor connected in series between a supply voltage and ground.

20. The method of claim 12, wherein the current source circuit includes a constant current source.

* * * * *